(12) United States Patent
Romano et al.

(10) Patent No.: US 6,684,499 B2
(45) Date of Patent: Feb. 3, 2004

(54) METHOD FOR FABRICATING A SPRING STRUCTURE

(75) Inventors: Linda T. Romano, Sunnyvale, CA (US); David K. Fork, Los Altos, CA (US); Harold Ackler, Boise, ID (US)

(73) Assignee: Xerox Corporation, Stamford, CT (US)

(*) Notice: Subject to any disclaimer, the term of this patent is extended or adjusted under 35 U.S.C. 154(b) by 55 days.

(21) Appl. No.: 10/041,548

(22) Filed: Jan. 7, 2002

(65) Prior Publication Data

US 2003/0129866 A1 Jul. 10, 2003

(51) Int. Cl.[7] .............................................. H01R 43/16
(52) U.S. Cl. ............................ 29/874; 29/842; 29/877; 29/885; 174/261; 361/776; 361/789; 438/117; 439/81
(58) Field of Search .......................... 29/842–844, 876, 29/874, 877, 885; 174/52.3, 260–261; 257/713, 723, 785, 786; 361/774, 776, 779, 789; 438/117, 611–612, 686; 439/66, 81

(56) References Cited

U.S. PATENT DOCUMENTS 3,842,189 A   10/1974   Southgate
5,613,861 A    3/1997   Smith et al.
6,290,510 B1 *  9/2001  Fork et al. ..................... 439/81
6,528,350 B2 *  3/2003  Fork ........................... 438/117

OTHER PUBLICATIONS

Article entitled: "Microfabrication By Electrochemical Metal Removal"; IBM J. Res. Dev. vol. 42, No. 5, p. 655 Sep. 5, 1998.

* cited by examiner

Primary Examiner—Peter Vo
Assistant Examiner—Donghai D. Nguyen
(74) Attorney, Agent, or Firm—Bever, Hoffman & Harms, LLP; Patrick T. Bever

(57) ABSTRACT

Methods are disclosed for fabricating spring structures in which a passive, conductive coating is deposited onto the spring structure before release. A release layer is deposited on a substrate and then a spring metal layer is formed thereon. A first mask is used to form a spring metal finger from these layers. A second mask defines a window exposing a tip of the finger. The release layer under the tip is etched through the window, and then a passive-conductive coating material (which may also have spring characteristics) is deposited on the tip. The second mask and residual coating material are then lifted off, and a third (release) mask is formed that is used to release a free end of the spring metal finger. The release mask is then stripped. When the passive-conductive coating includes spring characteristics, the stress variations of the coating help to lift the free end if the finger during release.

12 Claims, 4 Drawing Sheets

METHOD FOR FABRICATING A SPRING STRUCTURE

FIELD OF THE INVENTION

This invention generally relates to stress-engineered metal films, and more particularly to photo lithographically patterned micro-spring structures formed from stress-engineered metal films.

BACKGROUND OF THE INVENTION

Photo lithographically patterned spring structures (sometimes referred to as "microsprings") have been developed, for example, to produce low cost probe cards, and to provide electrical connections between integrated circuits. A typical spring structure includes a spring metal finger having an anchor portion secured to a substrate, and a free (cantilevered) portion extending from the anchored portion over the substrate. The spring metal finger is formed from a stress-engineered metal film (i.e., a metal film fabricated such that its lower portions have a higher internal compressive stress than its upper portions) that is at least partially formed on a release material layer. The free portion of the spring metal finger bends away from the substrate when the release material located under the free portion is etched away. The internal stress gradient is produced in the spring metal by layering different metals having the desired stress characteristics, or using a single metal by altering the fabrication parameters. Such spring metal structures may be used in probe cards, for electrically bonding integrated circuits, circuit boards, and electrode arrays, and for producing other devices such as inductors, variable capacitors, and actuated mirrors. For example, when utilized in a probe card application, the tip of the free portion is brought into contact with a contact pad formed on an integrated circuit, and signals are passed between the integrated circuit and test equipment via the probe card (i.e., using the spring metal structure as a conductor). Other examples of such spring structures are disclosed in U.S. Pat. No. 3,842,189 (Southgate) and U.S. Pat. No. 5,613,861 (Smith).

The present inventors have observed that conventional spring structures develop contact resistances that are detrimental to signal transmissions when the spring structures are used as conductors. The spring metal (e.g., Mo, MoCr, NiZr) is typically chosen for its ability to retain large amounts of internal stress. These materials typically oxidize in air, a phenomenon that can interfere with their ability to make electrical contact, for example, with the contact pad of an integrated circuit when used in a probe card. The spring metal materials can also gall to the contact pad, which is typically aluminum. Once the galled aluminum oxidizes, the contact resistance between the contact pad and the spring metal structure increases. One proposed approach to reducing contact resistance is to passivate the spring metal before etching and release. However, the passivating material tends to resist bending of the spring metal finger after release, and provides minimal coverage along the front edge at the tip, thereby allowing direct contact with the spring metal that can result in increased contact resistance.

What is needed is a spring metal structure that resists increased contact resistance by avoiding oxidation of the spring metal and/or galling of a contact pad against which the spring metal structure is pressed.

SUMMARY OF THE INVENTION

The present invention is directed to spring structures having passive-conductive coatings formed on a tip thereof, and to methods for fabricating these spring structures.

In accordance with a first embodiment of the present invention, the passive-conductive coating is formed using stress-engineering methods similar to those used to form the underlying spring finger. Like the underlying spring finger, the passive-conductive coating is formed with stress variations in the growth direction such that the passive-conductive coating help the stress-induced bending of the finger during the release process. After release, the passive-conductive coating provides a spring structure with reduced contact resistance when compared to non-coated spring structures.

In accordance with a second embodiment of the present invention, methods for fabricating microspring structures are disclosed in which a conductive coating (e.g., a refractory noble metal such as Rhodium (Rh), Iridium (Ir), Rhenium (Re), Platinum (Pt), and Palladium (Pd)) is deposited on the tip of the free (i.e., cantilevered) portion of the spring metal finger using an intermediate mask that is patterned between the formation (etching) of the spring finger and the release of the spring finger. A first mask is formed over sequentially formed release and spring metal layers that is used to etch the underlying spring metal and release layers to form a spring metal island formed on a release material island. The second mask is then formed with a window that exposes a tip of the spring metal island. In one embodiment, the second mask is photoresist formed with undercut (i.e., negative sloped) walls to facilitate liftoff of the passive-conductive coating formed on the upper surface of the second mask. To prevent the formation of a flange that may undesirably secure (anchor) the tip to the underlying substrate, the spring structure is briefly immersed in a release material etchant to remove the release material located under the tip prior to the deposition of the passive-conductive coating. The passive-conductive coating is then deposited through the second window onto the tip of the spring metal island. In one embodiment, a directional deposition process is utilized to facilitate shadowing. The second mask is then stripped, and a release mask is patterned that defines a window exposing a free end (including the tip) of the spring metal island for release. The structure is again immersed in the release material etchant, causing removal of the release material exposed by the release mask and bending of the exposed free portion of the spring metal island away from the substrate due to its internal stress, thereby becoming the free portion of a spring metal finger (an anchored portion of the spring metal finger remains covered by the release mask). The release mask may then be stripped.

BRIEF DESCRIPTION OF THE DRAWINGS

These and other features, aspects and advantages of the present invention will become better understood with regard to the following description, appended claims, and accompanying drawings, where:

FIGS. 4(A) through 4(L) are cross-sectional side views depicting portions of a fabrication method for producing the spring structure shown in FIG. 1;

DETAILED DESCRIPTION OF THE DRAWINGS

Figure 1:
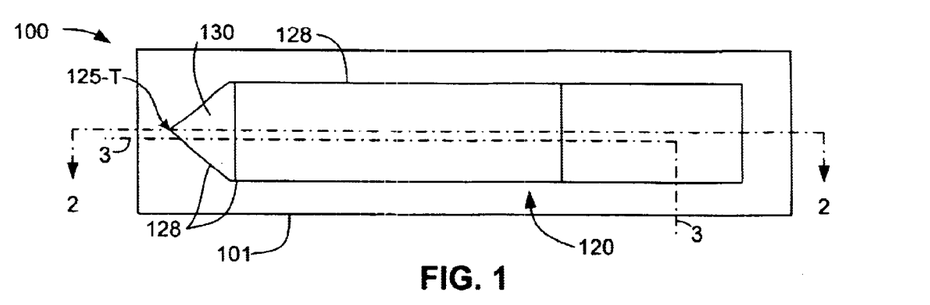
FIG. 1 is a plan view showing a spring structure according to a first embodiment of the present invention.
Figure 2:
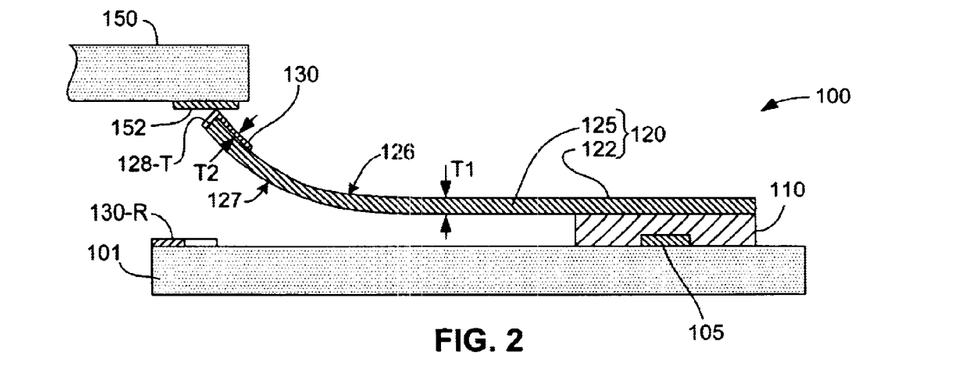
FIG. 2 is a cross-sectional side view of the spring structure taken along section line 2—2 of FIG. 1, and the spring structure contacting a separate integrated circuit.
Figure 3:
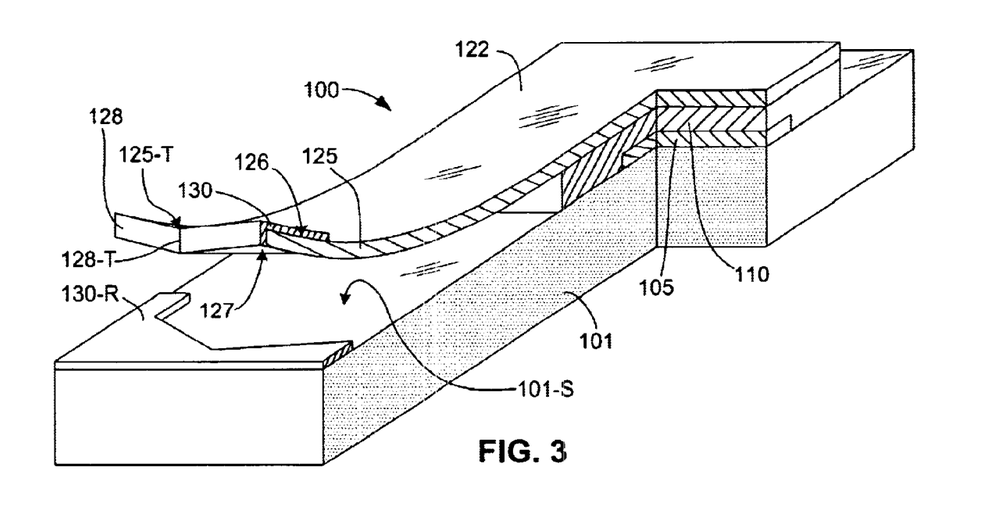
FIG. 3 is a cut-away perspective view of the spring structure shown in FIG. 1.

FIGS. 1, 2 and 3 show a spring structure 100 according to a first embodiment of the present invention. FIG. 1 is a plan view of spring structure 100, FIG. 2 is a cross-sectional side view taken along section line 2—2 of FIG. 1, and FIG. 3 is a perspective view with a cut-away section indicated by section line 3—3 in FIG. 1.

Spring structure 100 generally includes a substrate 101, a release material portion 110, and a spring metal finger 120. Substrate 101 (e.g., glass) includes an optional conductor 105 that can take several forms (i.e., a metal trace deposited on the substrate, as shown, or a buried conductor accessed by an opening in a passivation layer (not shown)). When present, conductor 105 may provide electrical connection between electronic components of an integrated circuit and spring structure 100. Alternatively, if substrate 101 is printed circuit board, printed wiring board, silicon device, or interposer, then conductor 105 may be an exposed portion of conducting material that is electrically connected to redistribution traces, through substrate vias, solder bumps, solder balls, mounted electrical components, integrated passive components, or interconnect pads. Release material portion 110 is formed on an upper surface of substrate 101 such that it contacts conductor 105 (if present). Spring metal finger 120 includes an anchor portion 122 and a free (i.e., cantilevered) portion 125. Anchor portion 122 is attached to release material portion 110 (i.e., such that release material portion 110 is located between anchor portion 122 and substrate 101). Free portion 125, which includes a tip 125-T, extends from anchor portion 122 over substrate 101, and includes an upper (first) surface 126 and an opposing lower (second) surface 127 that define a thickness T1 in the range of 0.1 and 10 microns (see FIG. 2). Note that edges 128 of free portion 125 extend between upper surface 126 and lower surface 127.

Similar to prior art spring structures, spring metal finger 120 is etched from a stress-engineered metal film that is formed by DC magnetron sputtering one or more metals using gas (e.g., Argon) pressure variations in the sputter environment during film growth in accordance with known techniques. By carefully selecting the metals and/or processing parameters, sputtered metal films can be used to form tightly curved spring metal fingers, or very stiff spring metal fingers, but not both simultaneously because increasing the film thickness (which is necessary to increase stiffness) also increases the radius of the resulting spring metal finger. Further, the internal stress of the stress-engineered metal film cannot be increased arbitrarily because of material limitations.

In accordance with the present invention, a passive, electrically conductive coating 130 is formed on upper surface 126 of free portion 125 at tip 125-T to minimize contact resistance between spring metal finger 120 and contact structure (e.g., a contact pad 152 formed on a separate integrated circuit 150, as shown in FIG. 2). In one embodiment, conductive coating 130 includes one or more of the refractory noble metals (e.g., Rhodium (Rh), Iridium (Ir), Rhenium (Re), Platinum (Pt), and Palladium (Pd)) having a thickness T2 in the range of 0.1 and 3 microns (see FIG. 2). As discussed below, conductive coating 130 is deposited after spring metal finger 120 is formed (etched), but before free portion 125 is released (i.e., before release material located under free portion 125 is removed, thereby allowing internal stress to bend free portion 125 away from substrate 101). Because conductive coating 130 is formed before free portion 125 is released, conductive coating 130 is deposited on upper surface 126 and front edges 128-T at tip 125-T. Accordingly, as shown in FIG. 2, spring structure 100 contacts external integrated circuit 150 through conductive coating 130. Note that conductive coating 130 passivates spring metal finger 120, which is important because most springy metals, such as stress-engineered metal film, form surface oxides. Conductive coating 130 also increases wear resistance and lubricity, and thereby resists the galling of an associated contact structure (e.g., contact pad 152, which is shown in FIG. 2). Finally, conductive coating 130 may be added to blunt the radii of process features and defects that can arise on spring metal finger 120.

In accordance with an alternative embodiment of the present invention, conductive coating 130 is formed using stress-engineering techniques similar to those used to form spring metal finger 120. By providing conductive coating 130 with stress variations in the growth direction (i.e., in the same direction as that of spring metal finger 120), conductive coating 130 may supplement the bending force at tip 125-T (e.g., if the coating is more tensile than the spring metal). As described below, during fabrication this supplemental bending force facilitates separation of tip 125-T from substrate 101 prior to release.

FIGS. 4(A) through 4(L) and FIGS. 5(A) through 5(C) illustrate a method for fabricating spring structure 100 (described above).

Figure 4A:
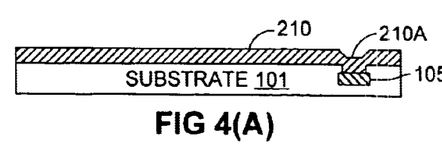

Referring to FIG. 4(A), the fabrication method begins with the formation of a release material layer 210 over a glass (silicon) substrate 101. In one embodiment, release material layer 210 is formed from an electrically conductive material, and a portion 210A of release material layer 210 contacts a conductor 105 that is exposed on the upper surface of substrate 101. In one embodiment, release material layer 210 is Titanium (Ti) that is sputter deposited onto substrate 101 to a thickness of approximately 0.05 microns or greater. Titanium provides desirable characteristics as a conductive release material layer due to its plasticity (i.e., its resistance to cracking) and its strong adhesion. Other release materials having the beneficial plastic characteristics of titanium may also be used. In other embodiments, release material layer 210 includes another metal, such as Copper (Cu), Aluminum (Al), Nickel (Ni), Zirconium (Zr), or Cobalt (Co). Release material layer 210 may also be formed using heavily doped silicon (Si). Further, two or more release material layers can be sequentially deposited to form a multi-layer structure. In yet another possible embodiment, any of the above-mentioned release materials can be sandwiched between two non-release material layers (i.e., materials that are not removed during the spring metal release process, described below). Alternatively, when it is not necessary to provide electrical conduction between the subsequently deposited spring metal layer and a contact pad (such as conductor 105), release material layer 210 can be a non-conducting material such as Silicon Nitride (SiN).

Figure 4B:
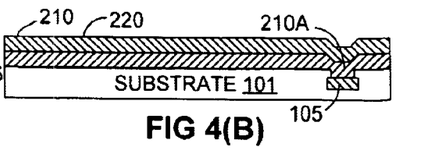

FIG. 4(B) shows a stress-engineered metal film 220 formed on release material layer 210 using known processing techniques such that it includes internal stress variations in the growth direction. For example, in one embodiment, stress-engineered metal film 220 is formed such that its lowermost portions (i.e., adjacent to release material layer 210) has a higher internal compressive stress than its upper portions, thereby causing stress-engineered metal film 220 to have internal stress variations that cause a spring metal finger to bend upward away from substrate 101 (discussed below). Methods for generating such internal stress variations in stress-engineered metal film 220 are taught, for example, in U.S. Pat. No. 3,842,189 (depositing two metals having different internal stresses) and U.S. Pat. No. 5,613,861 (e.g., single metal sputtered while varying process parameters), both of which being incorporated herein by reference. In one embodiment, which utilizes a 0.2 micron Ti release material layer, stress-engineered metal film 220 includes Molybdenum and Chromium (MoCr) sputter deposited to a thickness of 1 micron. In other embodiments, a Mo spring metal layer can be formed on SiN release material layers.

Note that when conductive release material is used, stress-engineered metal film 220 is separated from conductor 105 by portion 210A of release material layer 210. Accordingly, a separate masking step utilized in conventional fabrication methods to form an opening in the release material is not required, thereby reducing fabrication costs. Instead, as discussed below, the present embodiment utilizes the conductivity of release material layer 210 to provide electrical connection between conductor 105 and stress-engineered metal film 220.

Figure 4C:
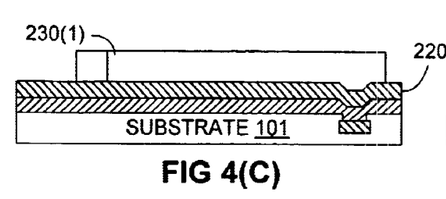
Figure 5A:
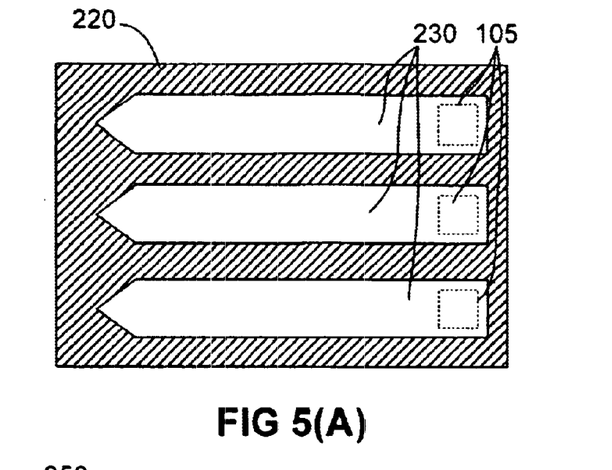
FIGS. 5(A), 5(B), and 5(C) are plan views showing the spring structure of FIG. 1 during selected fabrication steps.

Referring to FIGS. 4(C) and 5(A), elongated spring metal (first) masks 230 (e.g., photoresist) are then patterned over a selected portion of stress-engineered metal film 220. Note that each spring metal mask 230 extends over an associated conductor 105 (if present), as shown in FIG. 5(A). Cross-hatching is used in FIG. 5(A) to identify exposed portions of stress-engineered metal film 220 (i.e., not covered by masks 230).

Figure 4D:
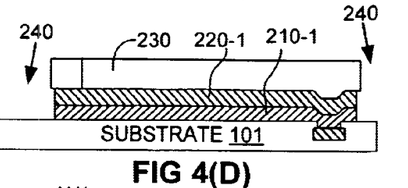

Next, as indicated in FIG. 4(D), exposed portions of stress-engineered metal film 220 surrounding the spring metal mask 230 are etched using one or more etchants 240 to form a spring metal island 220-1 and an underlying release material island 210-1. In one embodiment, the etching step may be performed using, for example, a wet etching process to remove exposed portions of the stress-engineered metal film. This embodiment was successfully performed using cerric ammonium nitrate solution to remove a MoCr spring metal layer. In another embodiment, anisotropic dry etching is used to etch both the stress-engineered metal film and underlying portions of the release material layer. This embodiment may be performed, for example, with Mo spring metal, and Si or Ti release layers. Mo, Si and Ti all etch in reactive fluorine plasmas. An advantage of dry etching the spring metal film is that it facilitates finer features and sharper tipped spring metal fingers. Materials that do not etch in reactive plasmas may still be etched anisotropically by physical ion etching methods, such as Argon ion milling. In yet another possible embodiment, the etching step can be performed using the electro-chemical etching process described in IBM J. Res. Dev. Vol. 42, No. 5, page 655 (Sep. 5, 1998), which is incorporated herein by reference. In addition, more than one mask may be used to form spring metal island 220-1 and release material island 210-1. Many additional process variations and material substitutions are therefore possible and the examples given are not intended to be limiting.

Figure 4E:
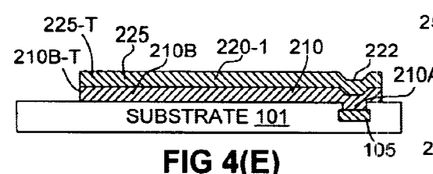

FIG. 4(E) shows spring metal island 220-1 and release material island 210-1 after spring metal mask 230 (FIG. 4(D)) is removed. Spring metal island 220-1 includes a first (anchor) portion 222 located adjacent to conductor 105, and a second (free) portion 225 extending away from conductor 105. Similarly, release material island 210-1 includes a first portion 210A located under first portion 222, and a second portion 210B located under second portion 225. Second portion 225 of spring metal island 220-1 defines a tip 225-T that is located over an associated portion 210B-T of release material island 210-1. Note again that, in the disclosed embodiment, electrical connection between conductor 105 and spring metal island 220-1 is provided through first portion 210-1A of release material island 210-1.

Figure 4F:
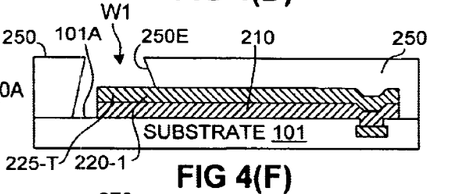

Referring to FIG. 4(F), an intermediate (second) mask 250 (e.g., photoresist) is then formed on spring metal island 220-1 that defines a window W1 through which tip 225-T of spring metal island 220-1 and surrounding portions 101A of substrate 101 are exposed. In one embodiment, intermediate mask 250 is intentionally formed with a negative sloped side wall 250E (for example, using negative resist or image reversal techniques) to facilitate the liftoff of the conductive coating deposited thereon, as discussed below.

Figure 5B:
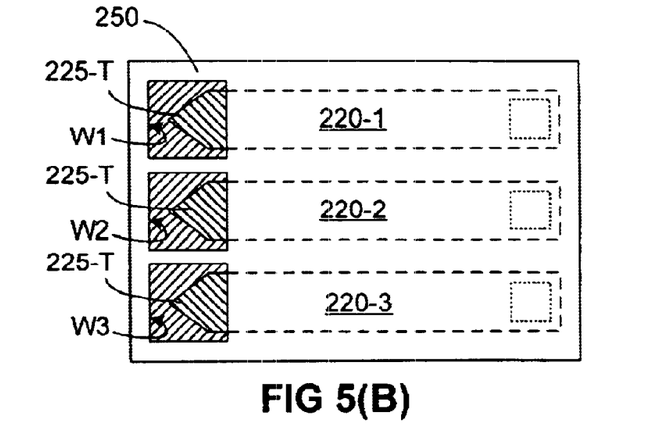

FIG. 5(B) is a plan view showing intermediate mask 250, and shows that tips 225-T of three spring metal islands 220-1 through 220-3 are exposed through windows W1 through W3, respectively. Cross-hatching is used to identify structures exposed through windows W1–W3. Separate windows are provided for each spring structure because each window will also define the pattern of the subsequently deposited conductive coating. That is, if two or more spring structures were exposed through the same window, then conductive coating would be deposited on substrate 101 separating the two spring structures, which would require an additional etching mask to remove the residual coating.

Figure 4G:
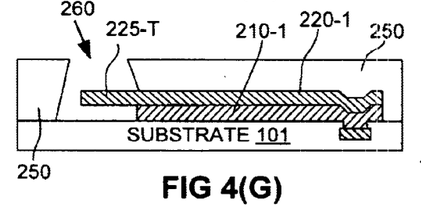

FIG. 4(G) shows a brief immersion in a release material etchant 260 (e.g., a buffered oxide etch) to facilitate separation of tip 225-T from substrate 101. By separating tip 225-T from substrate 101 prior to the deposition of conductive coating material, undesirably securing (anchoring) tip 225-T to exposed portion 101A of substrate 101 is avoided.

Figure 4H:
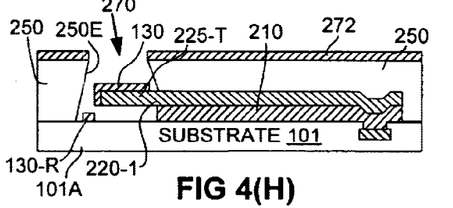

FIG. 4(H) shows the subsequent deposition of conductive coating material 270 that forms first portions 272 on the upper surface of intermediate mask 250, and passes through window W1 to form coating structure 130 on tip 225-T of spring metal island 220-1, and residual portions 130-R on exposed portions 101A of substrate 101. According to an aspect of the present invention, this deposition step is performed using a directional deposition source (e.g., using line-of-sight material flux from a small area source, such as electron beam evaporation or sputter deposition using a material collimator) to facilitate shadowing along the side edges of tip 225-T. Note that a flange structure that undesirably connects tip 225-T to substrate 101 is avoided by removing release material from under tip 225-T prior to the deposition of the conductive coating.

Figure 4I:
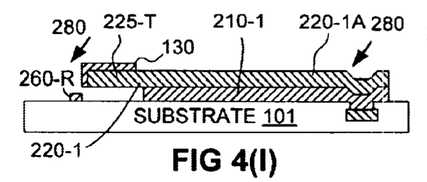

FIG. 4(I) shows the removal of release mask 250 and residual coating portions 272 (see FIGS. 4(G) and 4(H)) using a solvent 280. Referring briefly to FIG. 4(H), note that the negative-sloped side wall 250E of release mask 250 produces an exposed edge between coating portion 130 and residual coating portion 272. Returning to FIG. 4(I), this exposed edge allows access of a solvent 280 that dissolves the intermediate mask and lifts off the residual coating portions 272 formed thereon. In one embodiment, the intermediate mask is image-reversed photoresist, and acetone is used as solvent 280. If necessary, agitation may be used to accelerate the lift-off process. Because these residual coating portions are lifted off during the removal of intermediate mask 250, there is no need to identify a selective etch for the coating material, which is typically difficult to etch chemically. Note, however, that residual coating portions 130-R remain on substrate 101 (see FIG. 3). However, because each spring structure is formed in a separate release window (as shown in FIG. 5(B)), these residual coating portions remain isolated from adjacent conductive structures.

Figure 4J:
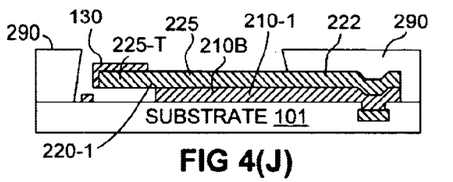

Referring to FIG. 4(J), a release (third) mask 290 (e.g., photoresist) is then formed over substrate 101 that masks anchor portion 222 of spring metal island 220-1, and defines a release window RW1 through which free portion 225 of spring metal island 220-1 is exposed.

Figure 5C:
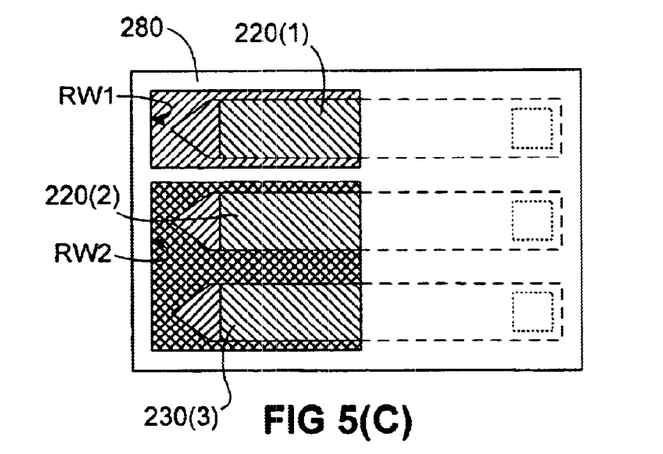

Referring to FIG. 5(C), note that release mask 250 can be formed either such that each spring metal island (e.g., island 230(1)) is exposed through a separate release window (e.g., window RW1), or such that two or more spring metal islands (e.g., islands 220(2) and 220(3)) are exposed through a common window (e.g., window RW2).

Figure 4K:
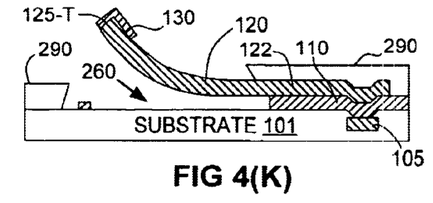

Referring to FIG. 4(K), a release etchant (e.g., release etchant 260, which was previously used to separate tip portion 225-T; see FIG. 4(G)) is then use to selectively remove portion 210B of the release material island 210-1 (FIG. 4(J)) from beneath the exposed free portion 225 of spring metal island 220-1 to form spring metal finger 120 (discussed above with reference to FIGS. 1–3). Specifically, removal of release material portion 210-B causes free portion 125 to bend away from substrate 101 due to the internal stress variations established during the formation of the spring metal film (discussed above). Note that anchor portion 122 remains secured to substrate 101 by remaining release material portion 110, which is protected by release mask 250. Note also that when release material portion 110 is formed from a conductive release material, the resulting spring structure is electrically coupled to conductor 105.

Finally, FIG. 4(L) shows an optional step of removing release mask 290 (shown in FIG. 4(K)) to complete the fabrication of spring structure 100, which is described above with reference to FIGS. 1–3. In some embodiments, release mask 290 is formed from a material such as polyimide that is not removed from the final structure.

Referring briefly to FIG. 3, note that optional conductor 105 is included to provide electrical coupling of spring structure 100 to an external electrical system (not shown). Note also that the electrical coupling between spring metal finger 120 and conductor 105 necessitates using an electrically conductive release material to form release material portion 110. However, as described below, electrical coupling can also be provided directly between conductor 105 and spring metal finger 120 by non-conductive anchoring materials.

Figure 6:
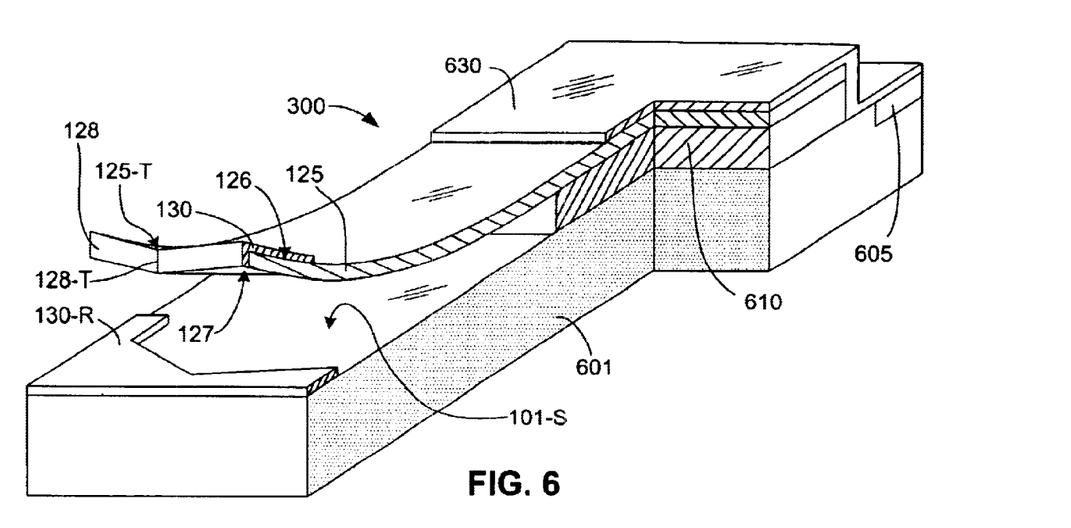
FIG. 6 is a cut-away perspective view showing a spring structure according to a second embodiment of the present invention.

FIG. 6 shows a spring structure 300 according to a second embodiment of the present invention. Similar to spring structure 100 (discussed above), spring structure 300 includes a base portion 610 formed on a substrate 601 adjacent to a conductor 605, a spring metal finger 120 formed on base portion 610, and a conductive coating 130 formed on a tip of spring metal finger 120. Spring metal finger 120 and conductive coating 130 are formed as described above. Spring structure 600 differs from spring structure 100 in that a strap 630 is also formed from the coating material that connects spring finger 120 to conductor 605.

Figure 7:
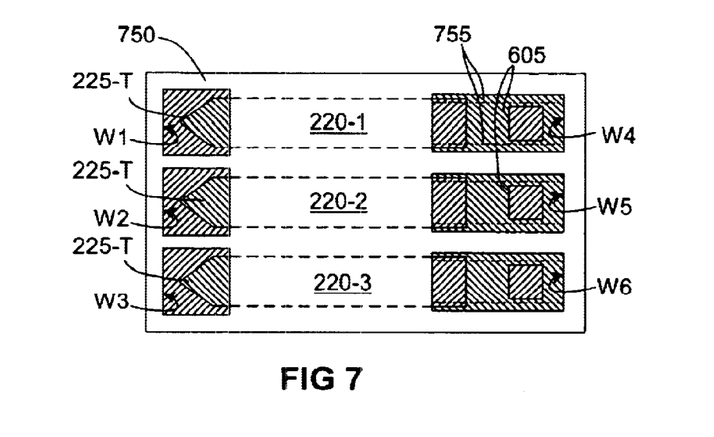
FIG. 7 is a plan view showing the spring structure of FIG. 6 immediately before the deposition of a passive-conductive coating.

FIG. 7 is a plan view showing an intermediate (second) mask 750 utilized in the fabrication of spring structure 600 (FIG. 6). Intermediate mask 750 is similar to release mask 250 (shown in FIG. 5(B)) in that it provides windows W1–W3 exposing tips 225-T of each spring metal island 220-1 through 220-3, but also includes an additional windows W4–W6 that exposes anchor portions 222 of each spring metal island 220-1 through 220-3. Note that windows W4–W6 also expose conductors 605 and surrounding portions of substrate 601 such that, during subsequent deposition of passive-conductive coating material, a strap is formed that electrically connects each spring metal island to a corresponding conductor. Note also that, when certain combinations of materials and etchants are used, the brief immersion into release etchant (described above with reference to FIG. 4(H)) may have to be omitted from the fabrication process to prevent the breakage of strap 630. Alternatively, base 610 may be formed from a different material than the release material, thereby avoiding removal of strap 630. In yet another alternative embodiment, mask 750 may be patterned as indicated by dashed lines 755 to avoid contact between base 610 and the release etchant during the brief immersion process.

Although the present invention has been described with respect to certain specific embodiments, it will be clear to those skilled in the art that the inventive features of the present invention are applicable to other embodiments as well, all of which are intended to fall within the scope of the present invention. For example, an optional in-situ milling or back sputtering step may be utilized to prepare the tip of each spring metal island for optimal adherence of the subsequently applied coating using known techniques. In another example, the coating deposition techniques described herein could be utilized to deposit a pyramidal structure, e.g., with Tungsten or Rhodium, to facilitate better contact.

What is claimed is:

1. A method for fabricating a spring structure on a substrate, the method comprising:

forming a spring metal island and a release material portion using at least one first mask such that at least a free portion of the spring metal island is formed on the release material portion, wherein the free portion defines a tip, and wherein the spring metal island has internal stress variations in a growth direction;

depositing a conductive coating on the tip of the spring metal island using a second mask; and selectively removing the release material portion from beneath the free portion of the spring metal island using a third mask that covers an anchor portion of the spring metal island, where upon removing the release material portion, the internal stress variations cause the free portion of the spring metal island to bend relative to the substrate, thereby forming a spring metal finger having the conductive coating formed thereon.

2. The method according to claim 1, wherein forming the spring metal island and release material portion comprises:

forming a release material layer using an electrically conducting material;

forming a stress-engineered metal film on the release material layer;

forming the first mask over an elongated region of the stress-engineered metal film; and etching exposed portions of the stress-engineered metal film and release material layer.

3. The method according to claim 2, wherein forming the stress-engineered metal film comprises depositing at least one of Molybdenum (Mo), Chromium (Cr), and Nickel-Zirconium (NiZr) on the release material layer, and wherein depositing the conductive coating comprises depositing at least one of Rh, Ir, Re, Pt, and Pd.

4. The method according to claim 3, wherein the electrically conductive release material portion comprises at least one metal selected from the group consisting of Ti, Cu, Al, Ni, Zr, and Co.

5. The method according to claim 2, wherein depositing the conductive coating comprises:

forming the second mask over the spring metal island, wherein the second mask defines an opening exposing the tip of the spring metal island, depositing a conductive coating layer over the second mask such that a first portion is formed on an upper surface of the second mask and a second portion is deposited on the tip of the spring metal island, and removing the second mask such that the first portion is lifted off.

6. The method according to claim 5, wherein forming the second mask comprises forming the opening such that side walls defining the opening are formed with a negative slope.

7. The method according to claim 5, further comprising etching a part of the release material portion located under the tip of the spring metal island before depositing the conductive coating.

8. The method according to claim 7, wherein etching the part of the release material portion comprises briefly immersion in a release etchant.

9. The method according to claim 5, wherein the second mask further defines a second window that expose the anchor portion of the spring metal island, the anchor portion being located at an opposite end of the spring metal island from the tip, and wherein depositing the conductive coating layer causes the formation of a third portion on the anchor portion.

10. The method according to claim 1, wherein depositing the conductive coating comprises directionally depositing at least one refractory nobel metal.

11. The method according to claim 10, further comprising etching a part of the release material portion located under the tip of the free portion before depositing the conductive coating.

12. A method for fabricating a spring structure on a substrate, the method comprising:

forming a spring metal island using a first mask such that at least a free portion of the spring metal island is formed on a release material portion, wherein the free portion defines a tip, and wherein the spring metal island has internal stress variations in a growth direction;

selectively removing a first part of the release material portion located adjacent to the tip of the spring metal island using a second mask;

depositing a conductive coating on the tip of the spring metal island using the second mask;

removing the second mask; and selectively removing a second part of the release material portion from beneath the free portion of the spring metal island using a third mask that covers an anchor portion of the spring metal island, where upon removing the release material portion, the internal stress variations cause the free portion of the spring metal island to bend relative to the substrate, thereby forming a spring metal finger having the conductive coating formed thereon.

* * * * *

UNITED STATES PATENT AND TRADEMARK OFFICE
CERTIFICATE OF CORRECTION

| | | |
|---|---|---|
| PATENT NO. | : 6,684,499 B2 | Page 1 of 1 |
| APPLICATION NO. | : 10/041548 | |
| DATED | : February 3, 2004 | |
| INVENTOR(S) | : Linda T. Romano et al. | |

It is certified that error appears in the above-identified patent and that said Letters Patent is hereby corrected as shown below:

Column 1, line 3, insert as a new paragraph:

This invention was made with Government support under 70NANB8H4008 awarded by NIST. The Government has certain rights in this invention.

Signed and Sealed this

Seventeenth Day of April, 2007

JON W. DUDAS
*Director of the United States Patent and Trademark Office*